(12) United States Patent
Song et al.

(10) Patent No.: US 9,916,881 B2
(45) Date of Patent: Mar. 13, 2018

(54) SEMICONDUCTOR SYSTEM (71) Applicant: SK hynix Inc., Icheon-si Gyeonggi-do (KR)

(72) Inventors: Keun Soo Song, Icheon-si (KR); Woo Yeol Shin, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 15/203,937

(22) Filed: Jul. 7, 2016

(65) Prior Publication Data

US 2017/0162245 A1    Jun. 8, 2017

(30) Foreign Application Priority Data

Dec. 3, 2015    (KR) ........................ 10-2015-0171663

(51) Int. Cl.
*G11C 8/18*    (2006.01)
*G11C 8/06*    (2006.01)
*G06F 13/42*    (2006.01)
*G11C 7/10*    (2006.01)
*G11C 7/22*    (2006.01)

(52) U.S. Cl.
CPC ............ *G11C 8/18* (2013.01); *G06F 13/4234* (2013.01); *G11C 7/1066* (2013.01); *G11C 7/1093* (2013.01); *G11C 7/222* (2013.01); *G11C 8/06* (2013.01)

(58) Field of Classification Search
CPC .................................. G11C 8/18; G11C 8/06
USPC .......................................... 365/230.01–233.5
See application file for complete search history.

(56) References Cited

U.S. PATENT DOCUMENTS

| 7,475,187 | B2* | 1/2009 | Gregorius | ............ | G11C 7/1006 711/104 |
| 2007/0073942 | A1* | 3/2007 | Gregorius | ............ | G11C 7/1006 710/71 |

* cited by examiner

*Primary Examiner* — Harry W Byrne
(74) *Attorney, Agent, or Firm* — William Park & Associates Ltd.

(57) ABSTRACT

A semiconductor system may include a controller and a semiconductor memory device. The controller may provide an external command, an external address and a first external clock. The controller may be configured to transmit a second external clock and receive a third external clock for receiving/transmitting external data. The semiconductor memory device may be configured to synchronize and receive the external address and the external command with the first external clock. The semiconductor memory device may be configured to synchronize and receive the external data with the second external clock. The semiconductor memory device may be configured to transmit the external data and the third external clock to the controller.

6 Claims, 4 Drawing Sheets

SEMICONDUCTOR SYSTEM

CROSS-REFERENCES TO RELATED APPLICATION

The present application claims priority under 35 U.S.C. § 119(a) to Korean application number 10-2015-0171663, filed on Dec. 3, 2015, in the Korean Intellectual Property Office, which is incorporated herein by reference in its entirety.

BACKGROUND

1. Technical Field

Various embodiments generally relate to a semiconductor integrated circuit device, and more particularly, to a semiconductor system.

2. Related Art

A semiconductor system may include a semiconductor circuit and a control circuit configured to control the semiconductor circuit. For example, the semiconductor system may include a semiconductor memory device and a controller.

The semiconductor memory device may be configured to store data. The controller may control the semiconductor memory device.

In order to manufacture the semiconductor system including the semiconductor memory device and the controller with a high speed, it may be required to provide the semiconductor memory device with a rapid data-processing speed, a rapid data-storing speed, and a rapid data-transmitting speed.

SUMMARY

According to an embodiment, there may be provided a semiconductor system. The semiconductor system may include a controller and a semiconductor memory device. The controller may provide an external command, an external address and a first external clock. The controller may be configured to transmit a second external clock and receive a third external clock for receiving/transmitting external data. The semiconductor memory device may be configured to synchronize and receive the external address and the external command with the first external clock. The semiconductor memory device may be configured to synchronize and receive the external data with the second external clock. The semiconductor memory device may be configured to transmit the external data and the third external clock to the controller.

According to an embodiment, there may be provided a semiconductor system. The semiconductor system may include a controller and a semiconductor memory device. The controller may be configured to synchronize and transmit a command and an address with a first external clock. The controller may be configured to synchronize and transmit an external data with a second external clock. The semiconductor memory device may be configured to synchronize and receive the command and the address with the first external clock, and receive the external data based on the second external clock.

According to an embodiment, there may be provided a semiconductor system. The semiconductor system may include a controller and a semiconductor memory device. The controller may provide an external command, an external address and a first external clock. The controller may be configured to transmit a second external clock and receive a third external clock for receiving/transmitting external data. The semiconductor memory device may be configured to synchronize and receive the external command and the external address with the first external clock. The semiconductor memory device may be configured to synchronize and receive the external data with the second external clock. The semiconductor memory device may be configured to transmit the external data based on any one of the first external clock and the second external clock, and transmit the third external clock based on any one of the first external clock and the second external clock.

According to an embodiment, there may be provided a semiconductor system. The semiconductor system may include a controller and a semiconductor memory device. The controller may provide an external command, an external address and a command/address-decoding clock. The controller may be configured to receive/transmit a data-receiving clock and a data-transmitting clock for receiving/transmitting external data. The semiconductor memory device may be configured to synchronize and receive the external command and the external address with the command/address-decoding clock. The semiconductor memory device may be configured to synchronize and receive the external data with the data-receiving clock. The semiconductor memory device may be configured to transmit the external data and the data-transmitting clock to the controller.

According to an embodiment, there may be provided a semiconductor system. The semiconductor system may include a controlling circuit and a semiconductor device. The controlling circuit may be configured to transmit a command signal and a first external clock to the semiconductor device. The controlling circuit may be configured to transmit a second external clock to the semiconductor device and receive a third external clock from the semiconductor device for transmitting/receiving an external data to/from the semiconductor device. The semiconductor device may be configured to receive the second external clock from the controlling circuit and transmit the third external clock to the controller for transmitting/receiving the external data to/from the controlling circuit.

According to an embodiment, there may be provided a semiconductor system. The semiconductor system may include a controlling circuit and a semiconductor device. The controlling circuit may be configured to transmit a control signal and a first external clock. The controlling circuit may be configured to transmit a second external clock and receive a third external clock for transmitting/receiving an external data. The semiconductor device may be configured to synchronize and receive the control signal with the first external clock. The semiconductor device may be configured to synchronize and receive the external data with any one of the first external clock and the second external clock. The semiconductor device may be configured to transmit the external data based on any one of the first external clock and the second external clock. The semiconductor device may be configured to transmit the second external clock based on the first external clock and the second external clock.

According to an embodiment, there may be provided a semiconductor system. The semiconductor system may include a controlling circuit. The semiconductor system may include a semiconductor device. The controlling circuit may be configured to transmit an external command and an external address to the semiconductor device using a first external clock. The controlling circuit may be configured to transmit data from the controller to the semiconductor device using a second external clock. The semiconductor device may be configured to process the external command and the external address received from the controlling circuit using the first external clock. The semiconductor device may be configured to process the data using the second external clock.

DETAILED DESCRIPTION

Various examples of embodiments will be described hereinafter with reference to the accompanying drawings, in which some examples of the embodiments are illustrated. The embodiments may, however, be embodied in many different forms and should not be construed as limited to the examples of embodiments set forth herein. Rather, these examples of embodiments are provided so that this disclosure will be thorough and complete, and will fully convey the scope of the present disclosure to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example of the term "below" can encompass both an orientation of above and below. The device may be otherwise oriented (rotated 90 degrees or at other orientations) and the spatially relative descriptors used herein interpreted accordingly.

The terminology used herein is for the purpose of describing particular examples of embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, examples of the embodiments will be explained with reference to the accompanying drawings.

Figure 1:
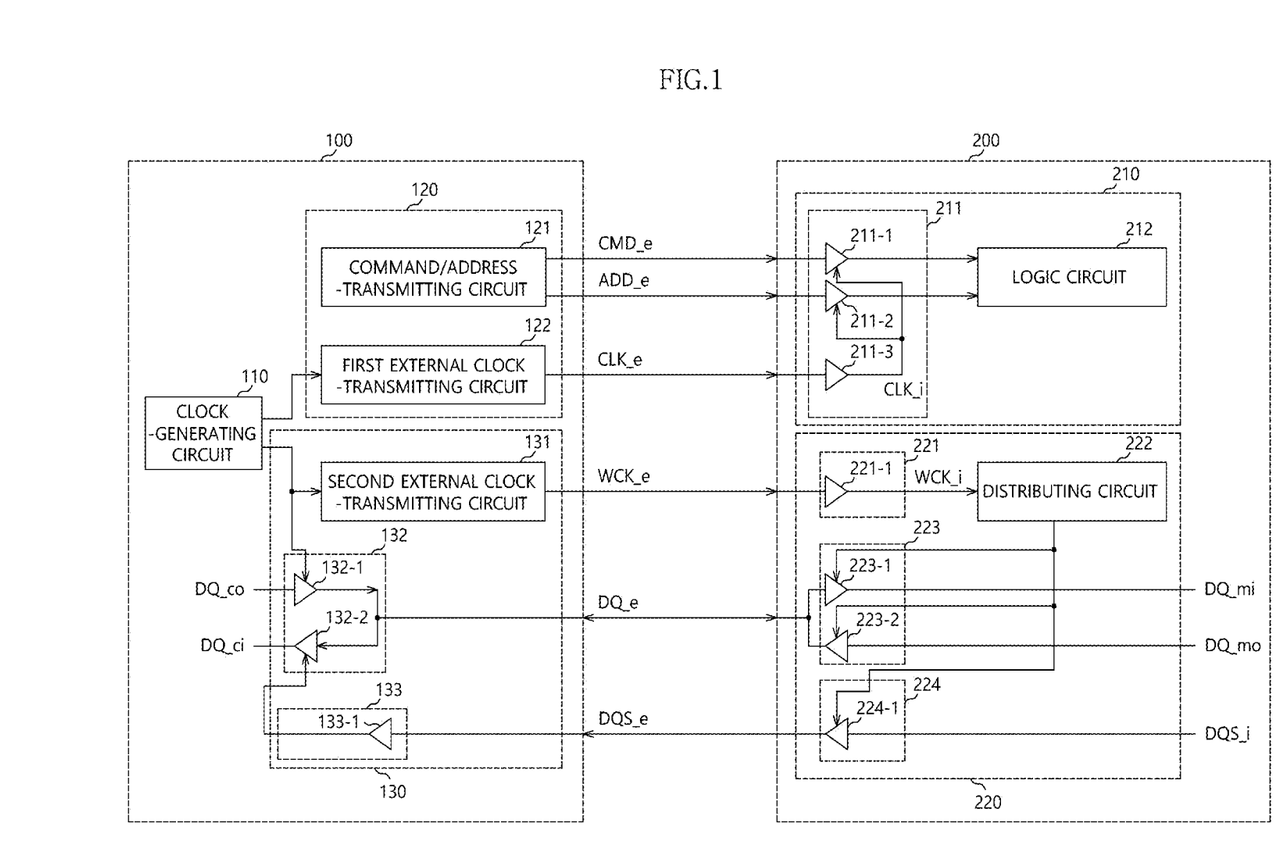
FIG. 1 is a circuit diagram illustrating a representation of an example of a semiconductor system in accordance with examples of embodiments.

FIG. 1 is a circuit diagram illustrating a representation of an example of a semiconductor system in accordance with examples of embodiments.

Referring to FIG. 1, a semiconductor system according to an example of an embodiment may include a controlling circuit 100 and a semiconductor device 200. The controlling circuit 100 may be realized by a controller, etc. The semiconductor device 200 may be realized by a semiconductor memory device, etc. The controlling circuit 100 may include other circuits and/or may be realized by other devices or circuits. The semiconductor device 200 may include other devices and/or may be realized by other devices or circuits.

The controller 100 may be configured to generate signals for controlling the semiconductor memory device 200. The controller may be configured to transmit the signals to the semiconductor memory device 200. For example, the controller 100 may transmit an external command CMD_e, an external address ADD_e and a first external clock CLK_e, which may be used for controlling operations of the semiconductor memory device 200, to the semiconductor memory device 200. The controller 100 may transmit a second external clock WCK_e and an external data DQ_e to the semiconductor memory device 200 and receive a third external clock DQS_e and the external data DQ_e from the semiconductor memory device 200 in order to transmit and receive (transmit/receive) data to and from (to/from) the semiconductor memory device 200.

The controller 100 may include a clock-generating circuit 110, a command/address/clock-transmitting circuit 120 and a first data/clock-transmitting/receiving circuit 130.

The clock-generating circuit 110 may include a circuit configured to generate a clock used in the controller 100. The clock-generating circuit 110 may include a phase locked loop (PLL) circuit, a delay locked loop (DLL) circuit, etc.

The command/address/clock-transmitting circuit 120 may include a command/address-transmitting circuit 121 and a first external clock-transmitting circuit 122.

The command/address-transmitting circuit 121 may transmit the external command CMD_e for commanding the operations of the semiconductor memory device 200, and the external address ADD_e for commanding storage positions of the external data DQ_e.

The first external clock-transmitting circuit 122 may receive the clock from the clock-generating circuit 110. The first external clock-transmitting circuit 122 may transmit the first external clock CLK_e to the semiconductor memory device 200. The first external clock CLK_e transmitted by the first external clock-transmitting circuit 122 may correspond to a signal for decoding the external command CMD_e and the external address ADD_e in the semiconductor memory device 200. Thus, the first external clock CLK_e may be a command/address-decoding clock CLK_e. The external command CMD_e and the external data DQ_e transmitted by the command/address-transmitting circuit 121 may be signals synchronized with the first external clock CLK_e.

The first data/clock-transmitting/receiving circuit 130 may include a second external clock-transmitting circuit 131, a first data-transmitting/receiving circuit 132 and a third external clock-receiving circuit 133.

The second external clock-transmitting circuit 131 may transmit the second external clock WCK_e, which may be used for decoding the external data DQ_e in the semiconductor memory device 200, to the semiconductor memory device 200. The second external clock WCK_e transmitted by the second external clock-transmitting circuit 131 may correspond to a signal for receiving data in the semiconductor memory device 200. Thus, the second external clock WCK_e may be a data-receiving clock WCK_e. Further, the second external clock WCK_e, i.e., the data-receiving clock WCK_e may have a frequency higher than that of the first external clock CLK_e, i.e., the command/address-decoding clock CLK_e. For example, the frequency of the second external clock WCK_e may be integer times of the frequency of the first external clock CLK_e.

The first data-transmitting/receiving circuit 132 may synchronize a controller-transmitting data DQ_co with the second external clock WCK_e to transmit the external data DQ_e. The first data-transmitting/receiving circuit 132 may synchronize the external data DQ_e with a third external clock DQS_e, i.e, an external data strobe signal DQS_e to transmit a controller-receiving data DQ_ci. When the semiconductor memory device 200 may transmit the external data DQ_e to the controller 100, the third external clock DQS_e may correspond to a clock transmitted by the semiconductor memory device 200 to the controller. Thus, the third external clock DQS_e may correspond to the data-receiving clock DQS_e. For example, the first data-transmitting/receiving circuit 132 may synchronize the data generated in the controller 100, i.e., the controller-transmitting data DQ_co with the second external clock WCK_e to transmit the external data DQ_e to the semiconductor memory device 200. The first data-transmitting/receiving circuit 132 may synchronize the data transmitted from the semiconductor memory device 200, i.e., the external data DQ_e with the third external clock DQS_e to transmit the controller-receiving data DQ_ci to the controller 100. The third external clock DQS_e may be a data-transmitting clock.

The first data-transmitting/receiving circuit 132 may include a first synchronous buffer 132-1 and a second synchronous buffer 132-2.

The first synchronous buffer 132-1 may transmit the controller-transmitting data DQ_co as the external data DQ_e in response to the second external clock WCK_e. For example, the first synchronous buffer 132-1 may synchronize the controller-transmitting data DQ_co with the second external clock WCK_e to transmit the external data DQ_e.

The second synchronous buffer 132-2 may transmit the external data DQ_e as the controller-receiving data DQ_ci in response to the third external clock DQS_e. For example, the second synchronous buffer 132-2 may synchronize the external data DQ_e with the third external clock DQS_e to transmit the controller-receiving data DQ_ci.

The third external clock-receiving circuit 133 may transmit the third external clock DQS_e to the second synchronous buffer 132-2. For example, the third external clock-receiving circuit 133 may buffer the third external clock DQS_e and transmit the buffered third external clock DQS_e to the second synchronous buffer 132-2.

The third external clock-receiving circuit 133 may include a first buffer 133-1 for buffering the third external clock DQS_e.

The semiconductor memory device 200 may be operated by controls of the controller 100. For example, the semiconductor memory device 200 may receive, store and transmit the data by the controls of the controller 100. Particularly, the semiconductor memory device 200 may perform operations designated by the controller 100 such as a read operation, a write operation, a refresh operation, etc. The semiconductor memory device 200 may store the data in a position designated by the controller 100 in the write operation. The semiconductor memory device 200 may transmit the data stored in the position designated by the controller 100 in the read operation. The semiconductor memory device 200 may receive the external command CMD_e, the external address ADD_e, the first external clock CLK_e, the second external clock WCK_e and the external data DQ_e from the controller 100. Further, the semiconductor memory device 200 may transmit the external data DQ_e and the third external clock DQS_e to the controller 100.

The semiconductor memory device 200 may include a command/address-processing circuit 210 and a second data/clock-transmitting/receiving circuit 220.

The command/address-processing circuit 210 may receive the external command CMD_e and the external address ADD_e in response to the first external clock CLK_e. The command/address-processing circuit 210 may transmit the external command CMD_e and the external address ADD_e to the semiconductor memory device 200.

The command/address-processing circuit 210 may include a command/address/clock-receiving circuit 211 and a logic circuit 212.

The command/address/clock-receiving circuit 211 may receive the external command CMD_e and the external address ADD_e in response to the first external clock CLK_e. For example, the command/address/clock-receiving circuit 211 may synchronize the external command CMD_e and the external address ADD_e with the first external clock CLK_e to transmit the external command CMD_e and the external address ADD_e to the logic circuit 212. The command/address/clock-receiving circuit 211 may include a third synchronous buffer 211-1, a fourth synchronous buffer 211-2 and a second buffer 211-3. The second buffer 211-3 may buffer the first external clock CLK_e to transmit a first internal clock CLK_i. The third synchronous buffer 211-1 may synchronize the external command CMD_e with the first internal clock CLK_i to transmit the synchronized external command CMD_e to the logic circuit 212. The fourth synchronous buffer 211-2 may synchronize the external address ADD_e with the first internal clock CLK_i to transmit the synchronized external address ADD_e to the logic circuit 212.

The logic circuit 212 may generate the signals used in the semiconductor memory device 200 in response to the signals received from the command/address/clock-receiving circuit 211. The logic circuit 212 may transmit the signals to the semiconductor memory device 200.

The second data/clock-transmitting/receiving circuit 220 may receive the external data DQ_e in response to the second external clock WCK_e to transmit a memory-receiving data DQ_mi. Further, the second data/clock-transmitting/receiving circuit 220 may transmit the memory-receiving data DQ_mi as the external data DQ_e in response to the second external clock WCK_e. The second data/clock-transmitting/receiving circuit 220 may transmit a data-transmitting signal DQS_i as the third external clock DQS_e in response to the second external clock WCK_e. The data-transmitting signal DQS_i may include an external data strobe signal.

The second data/clock-transmitting/receiving circuit 220 may include a second external clock-receiving circuit 221, a distributing circuit 222, a second data-transmitting/receiving circuit 223 and a third external clock-transmitting circuit 224.

The second external clock-receiving circuit 221 may transmit the second external clock WCK_e to the distributing circuit 222. For example, the second external clock-receiving circuit 221 may buffer the second external clock WCK_e to transmit a second internal clock WCK_i to the distributing circuit 222.

The second external clock-receiving circuit 221 may include a third buffer 221-1 configured to buffer the second external clock WCK_e and transmit the second internal clock WCK_i.

The distributing circuit 222 may receive the second internal clock WCK_i. The distributing circuit 222 may transmit the second internal clock WCK_i to the second data-transmitting/receiving circuit 223 and the third external clock-transmitting circuit 224. The distributing circuit 222 may include a clock tree.

The second data-transmitting/receiving circuit 223 may receive the external data DQ_e in response to the second internal clock WCK_i to transmit the memory-receiving data DQ_mi. The second data-transmitting/receiving circuit 223 may transmit the memory-transmitting data DQ_mo as the external data DQ_e in response to the second internal clock WCK_i.

The second data-transmitting/receiving circuit 223 may include a fifth synchronous buffer 223-1 and a sixth synchronous buffer 223-2.

The fifth synchronous buffer 223-1 may synchronize the external data DQ_e with the second internal clock WCK_i to transmit the memory-receiving data DQ_mi.

The sixth synchronous buffer 223-2 may synchronize the memory-transmitting data DQ_mo with the second internal clock WCK_i to transmit the external data DQ_e.

The third external clock-transmitting circuit 224 may transmit the data-transmitting signal DQS_i as the third external clock DQS_e in response to the second internal clock WCK_i. For example, the third external clock-transmitting circuit 224 may synchronize the data-transmitting signal DQS_i with the second internal clock WCK_i to transmit the third external clock DQS_e.

The third external clock-transmitting circuit 224 may include a seventh synchronous buffer 224-1. The seventh synchronous buffer 224-1 may synchronize the data-transmitting signal DQS_i with the second internal clock WCK_i to transmit the third external clock DQS_e.

In examples of various embodiments, the first to seventh synchronous buffers 132-1, 132-2, 211-1, 211-2, 223-1 and 223-2 may have substantially the same structure. Particularly, the first synchronous buffer 132-1, the second synchronous buffer 132-2, the fifth synchronous buffer 223-1 and the sixth synchronous buffer 223-2 for synchronizing the data with the clock may have substantially the same structure. That is, the first synchronous buffer 132-1, the second synchronous buffer 132-2, the fifth synchronous buffer 223-1 and the sixth synchronous buffer 223-2 for synchronizing the data with the clock may have substantially the same structure except for the signals.

For example, the first synchronous buffer 132-1 may synchronize the controller-transmitting data DQ_co with the second external clock WCK_e to transmit the external data DQ_e.

Figure 3:
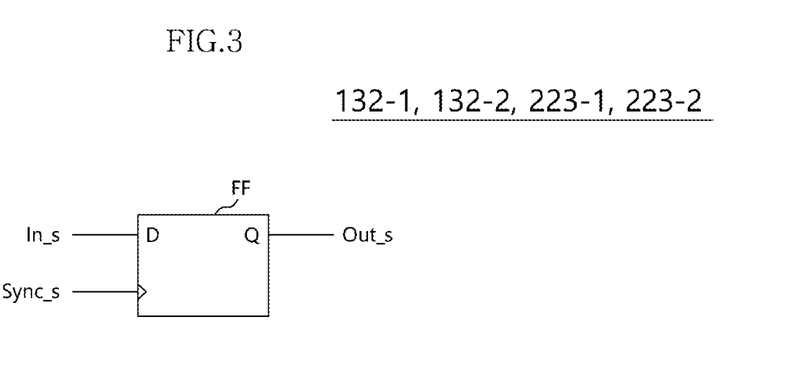
FIG. 3 is a circuit diagram illustrating a representation of an example of a synchronous buffer discussed with relation to FIGS. 1 and 2.

Referring to FIG. 3, the first synchronous buffer 132-1 may include a flip flop FF. For example, the second synchronous buffer 132-2, the fifth synchronous buffer 223-1 and the sixth synchronous buffer 223-2 may each include a flip flop FF.

The flip flop FF may synchronize a receiving signal In_s with a synchronizing signal Sync_s to transmit a transmitting signal Out_s. Particularly, the flip flop FF may latch the receiving signal In_s at a specific edge of the synchronizing signal Sync_s. The flip flop FF may transmit the latched signal as the transmitting signal Out_s. The receiving signal In_s may correspond to the controller-transmitting signal DQ_co. The synchronizing signal Sync_s may correspond to the second external clock WCK_e. The transmitting signal Out_s may correspond to the external data DQ_e.

Figure 4:
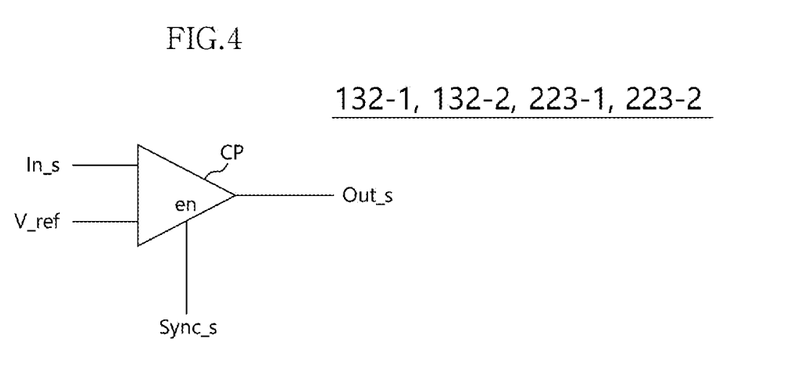
FIG. 4 is a circuit diagram illustrating a representation of an example of a synchronous buffer discussed with relation to FIGS. 1 and 2.

Referring to FIG. 4, the first synchronous buffer 132-1 may include a comparator CP. For example, the second synchronous buffer 132-2, the fifth synchronous buffer 223-1 and the sixth synchronous buffer 223-2 may each include a comparator CP.

When the synchronizing signal Sync_s is enabled, the comparator CP may compare a voltage level of the receiving signal In_s with a voltage level of a reference voltage V_ref to generate the transmitting signal Out_s. Because the comparator CP may generate and transmit the transmitting signal Out_s in response to the receiving signal In_s when the synchronizing signal Sync_s is enabled, the comparator CP may synchronize the receiving signal In_s with the synchronizing signal Sync_s to transmit the transmitting signal Out_s. The receiving signal In_s may correspond to the controller-transmitting signal DQ_co. The synchronizing signal Sync_s may correspond to the second external clock WCK_e. The transmitting signal Out_s may correspond to the external data DQ_e.

Hereinafter, examples of the operations of the semiconductor system may be presented below.

The controller 100 may transmit the data to the semiconductor memory device 200 as follows.

The command/address-transmitting circuit 121 of the controller 100 may transmit the external command CMD_e and the external address ADD_e to the semiconductor memory device 200. The external command CMD_e may include information for commanding the semiconductor memory device 200 to receive and store the data. The external address ADD_e may include information for designating the storage position of the data.

The first external clock-transmitting circuit 122 of the controller 100 may transmit the first external clock CLK_e to the semiconductor memory device 200.

The second external clock-transmitting circuit 131 of the controller 100 may transmit the second external clock WCK_e to the semiconductor memory device 200.

The first data-transmitting circuit 132 of the controller 100 may synchronize the controller-transmitting data DQ_co with the second external clock WCK_e to transmit the external data DQ_e.

Particularly, the first synchronous buffer 132-1 of the first data-transmitting circuit 132 may synchronize the controller-transmitting data DQ_co with the second external clock WCK_e to transmit the external data DQ_e.

The command/address/clock-receiving circuit 211 of the semiconductor memory device 200 may receive the external command CMD_e, the external address ADD_e and the first external clock CLK_e.

The second buffer 211-3 of the command/address/clock-receiving circuit 211 may buffer the first external clock CLK_e. The second buffer 211-3 may transmit the buffered first external clock CLK_e as the first internal clock CLK_i.

The third synchronous buffer 211-1 of the command/address/clock-receiving circuit 211 may synchronize the external command CMD_e with the first internal clock CLK_i. The third synchronous buffer 211-1 may transmit the buffered external command CMD_e to the logic circuit 212.

The fourth synchronous buffer 211-2 of the command/address/clock-receiving circuit 211 may synchronize the external address ADD_e with the first internal clock CLK_i. The fourth synchronous buffer 211-2 may transmit the buffered external address ADD_e to the logic circuit 212.

The logic circuit 212 may operate the semiconductor memory device 200 in accordance with the transmitting signals of the third and fourth synchronous buffer 211-1 and 211-2. For example, the logic circuit 212 may generate and transmit the signals for storing the external data DQ_e transmitted from the controller 100 in a position designated by the external address ADD_e in accordance with the transmitting signals of the third and fourth synchronous buffer 211-1 and 211-2.

The second external clock-receiving circuit 221 of the semiconductor memory device 200 may buffer the second external clock WCK_e. The second external clock-receiving circuit 221 may transmit the second internal clock WCK_i to the distributing circuit 222.

The distributing circuit 222 may transmit the second internal clock WCK_i to the second data-transmitting/receiving circuit 223.

The fifth synchronous buffer 223-1 of the second data-transmitting/receiving circuit 223 may synchronize the external data DQ_e with the second internal clock WCK_i. The fifth synchronous buffer 223-1 may transmit the memory-receiving data DQ_mi.

The semiconductor memory device 200 may transmit the data to the controller 100 as follows.

The command/address-transmitting circuit 121 of the controller 100 may transmit the external command CMD_e and the external address ADD_e to the semiconductor memory device 200. The external command CMD_e may include information for transmitting the data in the semiconductor memory device 200. The external address ADD_e may include information with respect to positions of the transmitted data.

The first external clock-transmitting circuit 122 of the controller 100 may transmit the first external clock CLK_e to the semiconductor memory device 200.

The second external clock-transmitting circuit 131 of the controller 100 may transmit the second external clock WCK_e to the semiconductor memory device 200.

The command/address/clock-receiving circuit 211 of the semiconductor memory device 200 may receive the external command CMD_e, the external address ADD_e and the first external clock CLK_e.

The second buffer 211-3 of the command/address/clock-receiving circuit 211 may buffer the first external clock CLK_e. The second buffer 211-3 may transmit the buffered first external clock CLK_e as the first internal clock CLK_i.

The third synchronous buffer 211-1 of the command/address/clock-receiving circuit 211 may synchronize the external command CMD_e with the first internal clock CLK_i. The third synchronous buffer 211-1 may transmit the buffered external command CMD_e to the logic circuit 212.

The fourth synchronous buffer 211-2 of the command/address/clock-receiving circuit 211 may synchronize the external address ADD_e with the first internal clock CLK_i. The fourth synchronous buffer 211-2 may transmit the buffered external address ADD_e to the logic circuit 212.

The logic circuit 212 may operate the semiconductor memory device 200 in accordance with the transmitting signals of the third and fourth synchronous buffer 211-1 and 211-2. For example, the logic circuit 212 may generate and transmit the signals for transmitting the position data, which may be designated by the external address ADD_e transmitted from the controller 100, to the controller 100 in accordance with the transmitting signals of the third and fourth synchronous buffer 211-1 and 211-2.

The second external clock-receiving circuit 221 of the semiconductor memory device 200 may buffer the second external clock WCK_e. The second external clock-receiving circuit 221 may transmit the second internal clock WCK_i to the distributing circuit 222.

The distributing circuit 222 may transmit the second internal clock WCK_i to the second data-transmitting/receiving circuit 223.

The sixth synchronous buffer 223-2 of the second data-transmitting/receiving circuit 223 may transmit the memory-transmitting data DQ_mo as the external data DQ_e in response to the second internal clock WCK_i received from the distributing circuit 222. Particularly, the sixth synchronous buffer 223-2 of the second data-transmitting/receiving circuit 223 may synchronize the memory-transmitting data DQ_mo with the second internal clock WCK_i. The sixth synchronous buffer 223-2 may transmit the external data DQ_e.

The third external clock-transmitting circuit 224 of the semiconductor memory device 200 may transmit the data-transmitting signal DQS_i as the third external clock DQS_e in response to the transmitting signal of the distributing circuit 222, i.e., the second internal clock WCK_i. Particularly, the seventh synchronous buffer 224-1 of the third external clock-transmitting circuit 224 may synchronize the data-transmitting signal DQS_i with the second internal clock WCK_i. The seventh synchronous buffer 224-1 may transmit the third external clock DQ_e.

The third external clock-receiving circuit 133 of the controller 100, i.e., the first buffer 133-1 may buffer the third external clock DQS_e. The first buffer 133-1 may transmit the buffered third external clock DQS_e to the second synchronous buffer 132-2 of the first data-transmitting/receiving circuit 132.

The second synchronous buffer 132-2 may synchronize the external data DQ_e with the third external clock DQS_e received from the first buffer 133-1. The second synchronous buffer 132-1 may transmit the controller-receiving data DQ_ci.

According to an example of an embodiment, the command and the address may be transmitted from the controller to the semiconductor memory device using the first external clock CLK_e. The data may be transmitted between the controller and the semiconductor memory device using the second external clock WCK_e. Thus, the semiconductor system may process the command and the address using the first external clock CLK_e, i.e., the command/address-decoding clock CLK_e, and the data using the second external clock WCK_e, i.e., the data-receiving clock WCK_e. As a result, when the frequency of the data-receiving clock WCK_e is higher than the frequency of the first external clock CLK_e, the semiconductor system may transmit and receive of the data including a lot of bits capable of reading or writing one time relatively than the command and the address.

Figure 2:
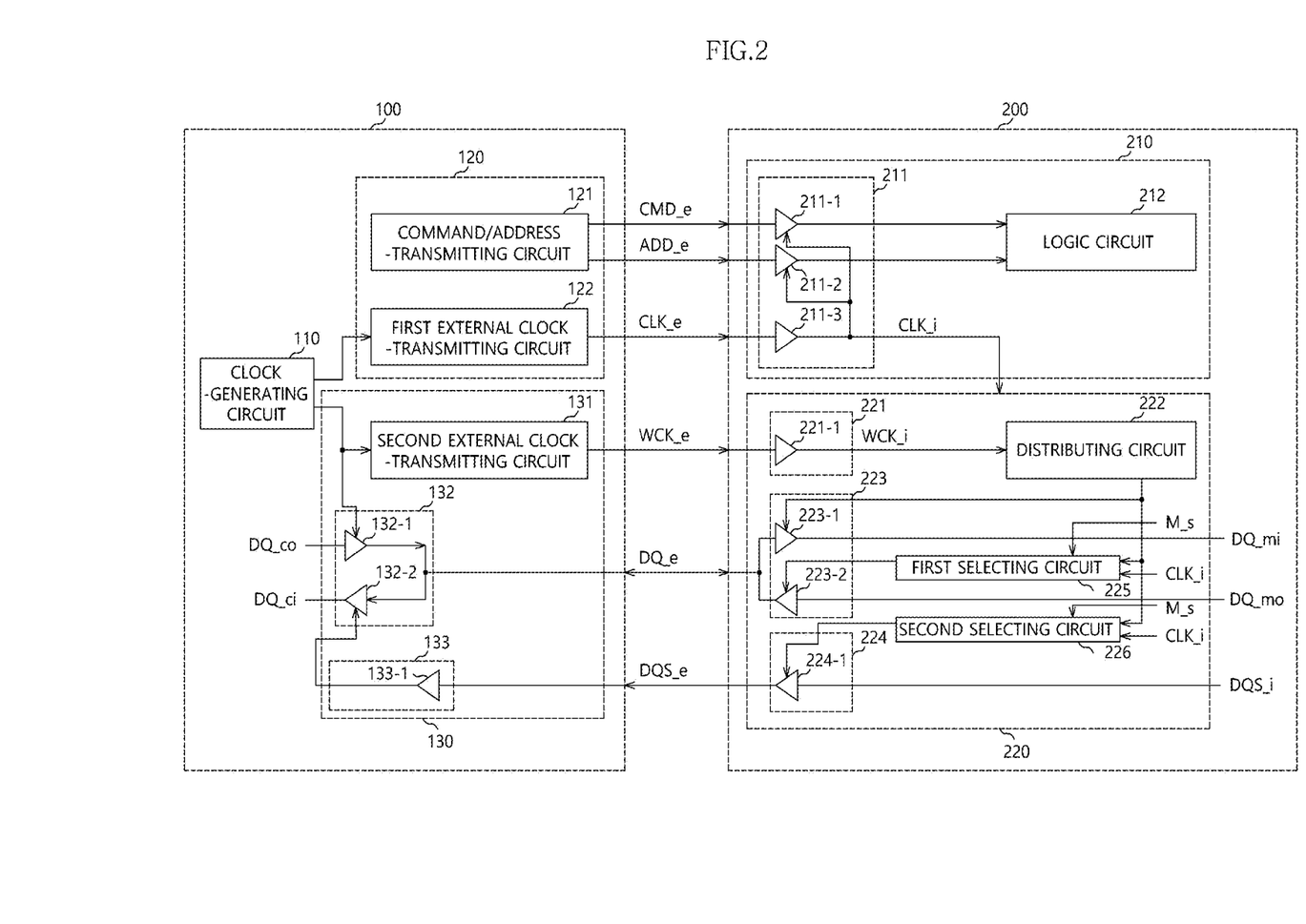
FIG. 2 is a circuit diagram illustrating a representation of an example of a semiconductor system in accordance with examples of embodiments.

FIG. 2 is a circuit diagram illustrating a representation of an example of a semiconductor system in accordance with examples of embodiments.

Referring to FIG. 2, a semiconductor system according to an example of an embodiment may include a controlling circuit 100 and a semiconductor device 200.

The controller 100 may be configured to generate signals for controlling the semiconductor memory device 200. The controller may be configured to transmit the signals to the semiconductor memory device 200. For example, the controller 100 may transmit an external command CMD_e, an external address ADD_e and a first external clock CLK_e, which may be used for controlling operations of the semiconductor memory device 200, to the semiconductor memory device 200. Further, the controller 100 may transmit a second external clock WCK_e and an external data DQ_e to the semiconductor memory device 200 and receive a third external clock DQS_e and the external data DQ_e from the semiconductor memory device 200 in order to rapidly and accurately transmitting/receiving data to/from the semiconductor memory device 200.

The controller 100 may include a clock-generating circuit 110, a command/address/clock-transmitting circuit 120 and a first data/clock-transmitting/receiving circuit 130.

The clock-generating circuit 110 may include a circuit configured to generate a clock used in the controller 100. The clock-generating circuit 110 may include a phase locked loop (PLL) circuit, a delay locked loop (DLL) circuit, etc.

The command/address/clock-transmitting circuit 120 may include a command/address-transmitting circuit 121 and a first external clock-transmitting circuit 122.

The command/address-transmitting circuit 121 may transmit the external command CMD_e for commanding the operations of the semiconductor memory device 200, and the external address ADD_e for commanding storage positions of the external data DQ_e.

The first external clock-transmitting circuit 122 may receive the clock from the clock-generating circuit 110. The first external clock-transmitting circuit 122 may transmit the first external clock CLK_e to the semiconductor memory device 200. The first external clock CLK_e transmitted by the first external clock-transmitting circuit 122 may correspond to a signal for decoding the external command CMD_e and the external address ADD_e in the semiconductor memory device 200. Thus, the first external clock CLK_e may be a command/address-decoding clock CLK_e.

The first data/clock-transmitting/receiving circuit 130 may include a second external clock-transmitting circuit 131, a first data-transmitting/receiving circuit 132 and a third external clock-receiving circuit 133.

The second external clock-transmitting circuit 131 may transmit the second external clock WCK_e, which may be used for decoding the external data DQ_e in the semiconductor memory device 200, to the semiconductor memory device 200. The second external clock WCK_e transmitted by the second external clock-transmitting circuit 131 may correspond to a signal for receiving data in the semiconductor memory device 200. Thus, the second external clock WCK_e may be a data-receiving clock WCK_e. Further, the second external clock WCK_e, i.e., the data-receiving clock WCK_e may have a frequency higher than that of the first external clock CLK_e, i.e., the command/address-decoding clock CLK_e. For example, the frequency of the second external clock WCK_e may be integer times of the frequency of the first external clock CLK_e.

The first data-transmitting/receiving circuit 132 may synchronize a controller-transmitting data DQ_co with the second external clock WCK_e to transmit the external data DQ_e. The first data-transmitting/receiving circuit 132 may synchronize the external data DQ_e with a third external clock DQS_e, i.e, an external data strobe signal DQS_e to transmit a controller-receiving data DQ_ci. For example, the first data-transmitting/receiving circuit 132 may synchronize the data generated in the controller 100, i.e., the controller-transmitting data DQ_co with the second external clock WCK_e to transmit the external data DQ_e to the semiconductor memory device 200. The first data-transmitting/receiving circuit 132 may synchronize the data transmitted from the semiconductor memory device 200, i.e., the external data DQ_e with the third external clock DQS_e to transmit the controller-receiving data DQ_ci to the controller 100.

The first data-transmitting/receiving circuit 132 may include a first synchronous buffer 132-1 and a second synchronous buffer 132-2.

The first synchronous buffer 132-1 may transmit the controller-transmitting data DQ_co as the external data DQ_e in response to the second external clock WCK_e. For example, the first synchronous buffer 132-1 may synchronize the controller-transmitting data DQ_co with the second external clock WCK_e to transmit the external data DQ_e.

The second synchronous buffer 132-2 may transmit the external data DQ_e as the controller-receiving data DQ_ci in response to the third external clock DQS_e. For example, the second synchronous buffer 132-2 may synchronize the external data DQ_e with the third external clock DQS_e to transmit the controller-receiving data DQ_ci.

The third external clock-receiving circuit 133 may transmit the third external clock DQS_e to the second synchronous buffer 132-2. For example, the third external clock-receiving circuit 133 may buffer the third external clock DQS_e and transmit the buffered third external clock DQS_e to the second synchronous buffer 132-2.

The third external clock-receiving circuit 133 may include a first buffer 133-1 for buffering the third external clock DQS_e.

The semiconductor memory device 200 may be operated by controls of the controller 100. For example, the semiconductor memory device 200 may receive, store and transmit the data by the controls of the controller 100. Particularly, the semiconductor memory device 200 may perform operations designated by the controller 100 such as a read operation, a write operation, a refresh operation, etc. The semiconductor memory device 200 may store the data in a position designated by the controller 100 in the write operation. The semiconductor memory device 200 may transmit the data stored in the position designated by the controller 100 in the read operation.

The semiconductor memory device 200 may receive the external command CMD_e, the external address ADD_e, the first external clock CLK_e, the second external clock WCK_e and the external data DQ_e from the controller 100. Further, the semiconductor memory device 200 may transmit the external data DQ_e and the third external clock DQS_e to the controller 100.

The semiconductor memory device 200 may include a command/address-processing circuit 210 and a second data/clock-transmitting/receiving circuit 220.

The command/address-processing circuit 210 may receive the external command CMD_e and the external address ADD_e in response to the first external clock CLK_e. The command/address-processing circuit 210 may transmit the external command CMD_e and the external address ADD_e to the semiconductor memory device 200.

The command/address-processing circuit 210 may include a command/address/clock-receiving circuit 211 and a logic circuit 212.

The command/address/clock-receiving circuit 211 may receive the external command CMD_e and the external address ADD_e in response to the first external clock CLK_e. For example, the command/address/clock-receiving circuit 211 may synchronize the external command CMD_e and the external address ADD_e with the first external clock CLK_e to transmit the external command CMD_e and the external address ADD_e to the logic circuit 212. The command/address/clock-receiving circuit 211 may include a third synchronous buffer 211-1, a fourth synchronous buffer 211-2 and a second buffer 211-3. The second buffer 211-3 may buffer the first external clock CLK_e to transmit a first internal clock CLK_i. The third synchronous buffer 211-1 may synchronize the external command CMD_e with the first internal clock CLK_i to transmit the synchronized external command CMD_e to the logic circuit 212. The fourth synchronous buffer 211-2 may synchronize the external address ADD_e with the first internal clock CLK_i to transmit the synchronized external address ADD_e to the logic circuit 212.

The logic circuit 212 may generate the signals used in the semiconductor memory device 200 in response to the signals received from the command/address/clock-receiving circuit 211. The logic circuit 212 may transmit the signals to the semiconductor memory device 200.

The second data/clock-transmitting/receiving circuit 220 may receive the external data DQ_e in response to the second external clock WCK_e to transmit a memory-receiving data DQ_mi. Further, the second data/clock-transmitting/receiving circuit 220 may transmit the memory-receiving data DQ_mi as the external data DQ_e in response to any one of the first external clock CLK_e and the second external clock WCK_e. The second data/clock-transmitting/receiving circuit 220 may transmit a data-transmitting signal DQS_i as the third external clock DQS_e in response to any one of the first external clock CLK_e and the second external clock WCK_e. The data-transmitting signal DQS_i may include an external data strobe signal.

The second data/clock-transmitting/receiving circuit 220 may include a second external clock-receiving circuit 221, a distributing circuit 222, a second data-transmitting/receiving circuit 223, a third external clock-transmitting circuit 224, a first selecting circuit 225 and a second selecting circuit 226.

The second external clock-receiving circuit 221 may transmit the second external clock WCK_e to the distributing circuit 222. For example, the second external clock-receiving circuit 221 may buffer the second external clock WCK_e to transmit a second internal clock WCK_i to the distributing circuit 222.

The second external clock-receiving circuit 221 may include a third buffer 221-1 configured to buffer the second external clock WCK_e and transmit the second internal clock WCK_i.

The distributing circuit 222 may receive the second internal clock WCK_i. The distributing circuit 222 may transmit the second internal clock WCK_i to the second data-transmitting/receiving circuit 223 and the third external clock-transmitting circuit 224. The distributing circuit 222 may include a clock tree.

The second data-transmitting/receiving circuit 223 may receive the external data DQ_e in response to the second internal clock WCK_i to transmit the memory-receiving data DQ_mi. The second data-transmitting/receiving circuit 223 may transmit the memory-transmitting data DQ_mo as the external data DQ_e in response to the second internal clock WCK_i.

The second data-transmitting/receiving circuit 223 may include a fifth synchronous buffer 223-1 and a sixth synchronous buffer 223-2.

The fifth synchronous buffer 223-1 may synchronize the external data DQ_e with the second internal clock WCK_i to transmit the memory-receiving data DQ_mi.

The sixth synchronous buffer 223-2 may synchronize the memory-transmitting data DQ_mo with the second internal clock WCK_i to transmit the external data DQ_e.

The third external clock-transmitting circuit 224 may transmit the data-transmitting signal DQS_i as the third external clock DQS_e in response to any one of the first internal clock CLK_i and the second internal clock WCK_i. For example, the third external clock-transmitting circuit 224 may synchronize the data-transmitting signal DQS_i with the second internal clock WCK_i to transmit the third external clock DQS_e.

The third external clock-transmitting circuit 224 may include a seventh synchronous buffer 224-1. The seventh synchronous buffer 224-1 may synchronize the data-transmitting signal DQS_i with the second internal clock WCK_i to transmit the third external clock DQS_e.

The first selecting circuit 225 may transmit any one of the first internal clock CLK_i and the second internal clock WCK_i to the sixth synchronous buffer 223-2 in response to a mode selection signal M_s. For example, when the mode selection signal M_s is enabled, the first selecting circuit 225 may transmit the first internal clock CLK_i to the sixth synchronous buffer 223-2. When the mode selection signal M_s is disabled, the first selecting circuit 225 may transmit the second internal clock WCK_i to the sixth synchronous buffer 223-2.

The second selecting circuit 226 may transmit any one of the first internal clock CLK_i and the second internal clock WCK_i to the seventh synchronous buffer 224-1 in response to the mode selection signal M_s. For example, when the mode selection signal M_s is enabled, the second selecting circuit 226 may transmit the first internal clock CLK_i to the seventh synchronous buffer 224-1. When the mode selection signal M_s is disabled, the second selecting circuit 226 may transmit the second internal clock WCK_i to the seventh synchronous buffer 224-1.

In examples of various embodiments, the first to seventh synchronous buffers 132-1, 132-2, 211-1, 211-2, 223-1 and 223-2 may have substantially the same structure. Particularly, the first synchronous buffer 132-1, the second synchronous buffer 132-2, the fifth synchronous buffer 223-1 and the sixth synchronous buffer 223-2 for synchronizing the data with the clock may have substantially the same structure. That is, the first synchronous buffer 132-1, the second synchronous buffer 132-2, the fifth synchronous buffer 223-1 and the sixth synchronous buffer 223-2 for synchronizing the data with the clock may have substantially the same structure except for the signals.

For example, the first synchronous buffer 132-1 may synchronize the controller-transmitting data DQ_co with the second external clock WCK_e to transmit the external data DQ_e.

Referring to FIG. 3, the first synchronous buffer 132-1 may include a flip flop FF. For example, the second synchronous buffer 132-2, the fifth synchronous buffer 223-1 and the sixth synchronous buffer 223-2 may each include a flip flop FF.

The flip flop FF may synchronize a receiving signal In_s with a synchronizing signal Sync_s to transmit a transmitting signal Out_s. Particularly, the flip flop FF may latch the receiving signal In_s at a specific edge of the synchronizing signal Sync_s. The flip flop FF may transmit the latched signal as the transmitting signal Out_s. The receiving signal In_s may correspond to the controller-transmitting signal DQ_co. The synchronizing signal Sync_s may correspond to the second external clock WCK_e. The transmitting signal Out_s may correspond to the external data DQ_e.

Referring to FIG. 4, the first synchronous buffer 132-1 may include a comparator CP. For example, the second synchronous buffer 132-2, the fifth synchronous buffer 223-1 and the sixth synchronous buffer 223-2 may each include a comparator CP.

When the synchronizing signal Sync_s is enabled, the comparator CP may compare a voltage level of the receiving signal In_s with a voltage level of a reference voltage V_ref to generate the transmitting signal Out_s. Because the comparator CP may generate and transmit the transmitting signal Out_s in response to the receiving signal In_s when the synchronizing signal Sync_s is enabled, the comparator CP may synchronize the receiving signal In_s with the synchronizing signal Sync_s to transmit the transmitting signal Out_s. The receiving signal In_s may correspond to the controller-transmitting signal DQ_co. The synchronizing signal Sync_s may correspond to the second external clock WCK_e. The transmitting signal Out_s may correspond to the external data DQ_e.

Hereinafter, examples of the operations of the semiconductor system may be presented below.

The controller 100 may transmit the data to the semiconductor memory device 200 as follows.

The command/address-transmitting circuit 121 of the controller 100 may transmit the external command CMD_e and the external address ADD_e to the semiconductor memory device 200. The external command CMD_e may include information for commanding the semiconductor memory device 200 to receive and store the data. The external address ADD_e may include information for designating the storage position of the data.

The first external clock-transmitting circuit 122 of the controller 100 may transmit the first external clock CLK_e to the semiconductor memory device 200.

The second external clock-transmitting circuit 131 of the controller 100 may transmit the second external clock WCK_e to the semiconductor memory device 200.

The first data-transmitting circuit 132 of the controller 100 may synchronize the controller-transmitting data DQ_co with the second external clock WCK_e to transmit the external data DQ_e. Particularly, the first synchronous buffer 132-1 of the first data-transmitting circuit 132 may synchronize the controller-transmitting data DQ_co with the second external clock WCK_e to transmit the external data DQ_e.

The command/address/clock-receiving circuit 211 of the semiconductor memory device 200 may receive the external command CMD_e, the external address ADD_e and the first external clock CLK_e.

The second buffer 211-3 of the command/address/clock-receiving circuit 211 may buffer the first external clock CLK_e. The second buffer 211-3 may transmit the buffered first external clock CLK_e as the first internal clock CLK_i.

The third synchronous buffer 211-1 of the command/address/clock-receiving circuit 211 may synchronize the external command CMD_e with the first internal clock CLK_i. The third synchronous buffer 211-1 may transmit the buffered external command CMD_e to the logic circuit 212.

The fourth synchronous buffer 211-2 of the command/address/clock-receiving circuit 211 may synchronize the external address ADD_e with the first internal clock CLK_i. The fourth synchronous buffer 211-2 may transmit the buffered external address ADD_e to the logic circuit 212.

The logic circuit 212 may operate the semiconductor memory device 200 in accordance with the transmitting signals of the third and fourth synchronous buffer 211-1 and 211-2. For example, the logic circuit 212 may generate and transmit the signals for storing the external data DQ_e transmitted from the controller 100 in a position designated by the external address ADD_e in accordance with the transmitting signals of the third and fourth synchronous buffer 211-1 and 211-2.

The second external clock-receiving circuit 221 of the semiconductor memory device 200 may buffer the second external clock WCK_e. The second external clock-receiving circuit 221 may transmit the second internal clock WCK_i to the distributing circuit 222.

The distributing circuit 222 may transmit the second internal clock WCK_i to the second data-transmitting/receiving circuit 223.

The fifth synchronous buffer 223-1 of the second data-transmitting/receiving circuit 223 may synchronize the external data DQ_e with the second internal clock WCK_i. The fifth synchronous buffer 223-1 may transmit the memory-receiving data DQ_mi.

The semiconductor memory device 200 may transmit the data to the controller 100 as follows.

The command/address-transmitting circuit 121 of the controller 100 may transmit the external command CMD_e and the external address ADD_e to the semiconductor memory device 200. The external command CMD_e may include information for transmitting the data in the semiconductor memory device 200. The external address ADD_e may include information with respect to positions of the transmitted data.

The first external clock-transmitting circuit 122 of the controller 100 may transmit the first external clock CLK_e to the semiconductor memory device 200.

The second external clock-transmitting circuit 131 of the controller 100 may transmit the second external clock WCK_e to the semiconductor memory device 200.

The command/address/clock-receiving circuit 211 of the semiconductor memory device 200 may receive the external command CMD_e, the external address ADD_e and the first external clock CLK_e.

The second buffer 211-3 of the command/address/clock-receiving circuit 211 may buffer the first external clock CLK_e. The second buffer 211-3 may transmit the buffered first external clock CLK_e as the first internal clock CLK_i.

The third synchronous buffer 211-1 of the command/address/clock-receiving circuit 211 may synchronize the external command CMD_e with the first internal clock CLK_i. The third synchronous buffer 211-1 may transmit the buffered external command CMD_e to the logic circuit 212.

The fourth synchronous buffer 211-2 of the command/address/clock-receiving circuit 211 may synchronize the external address ADD_e with the first internal clock CLK_i. The fourth synchronous buffer 211-2 may transmit the buffered external address ADD_e to the logic circuit 212.

The logic circuit 212 may operate the semiconductor memory device 200 in accordance with the transmitting signals of the third and fourth synchronous buffer 211-1 and 211-2. For example, the logic circuit 212 may generate and transmit the signals for transmitting the position data, which may be designated by the external address ADD_e transmitted from the controller 100, to the controller 100 in accordance with the transmitting signals of the third and fourth synchronous buffer 211-1 and 211-2.

The second external clock-receiving circuit 221 of the semiconductor memory device 200 may buffer the second external clock WCK_e. The second external clock-receiving circuit 221 may transmit the second internal clock WCK_i to the distributing circuit 222.

The distributing circuit 222 may transmit the second internal clock WCK_i to the second data-transmitting/receiving circuit 223. The distributing circuit 222 may transmit the second internal clock WCK_i to the first selecting circuit 225. The distributing circuit 222 may transmit the second internal clock WCK_i to the second selecting circuit 226.

The sixth synchronous buffer 223-2 of the second data-transmitting/receiving circuit 223 may transmit the memory-transmitting data DQ_mo as the external data DQ_e in response to the transmitting signal of the first selecting circuit 225. Particularly, the sixth synchronous buffer 223-2 of the second data-transmitting/receiving circuit 223 may synchronize the memory-transmitting data DQ_mo with any one of the first internal clock CLK_i and the second internal clock WCK_i. The sixth synchronous buffer 223-2 may transmit the external data DQ_e. When the first selecting circuit 225 receives the enabled mode selection signal M_s, the sixth synchronous buffer 223-2 may synchronize the memory-transmitting data DQ_mo with the first internal clock CLK_i to transmit the external data DQ_e. When the first selecting circuit 225 receives the disabled mode selection signal M_s, the sixth synchronous buffer 223-2 may synchronize the memory-transmitting data DQ_mo with the second internal clock WCK_i to transmit the external data DQ_e.

The third external clock-transmitting circuit 224 of the semiconductor memory device 200 may transmit the data-transmitting signal DQS_i as the third external clock DQS_e in response to the transmitting signal of the second selecting circuit 226, i.e., any one of the first internal clock CLK_i and the second internal clock WCK_i. Particularly, the seventh synchronous buffer 224-1 of the third external clock-transmitting circuit 224 may synchronize the data-transmitting signal DQS_i with any one of the first internal clock CLK_i and the second internal clock WCK_i. The seventh synchronous buffer 224-1 may transmit the third external clock DQ_e. When the second selecting circuit 226 receives the enabled mode selection signal M_s, the seventh synchronous buffer 224-1 may synchronize the memory-transmitting data DQ_mo with the first internal clock CLK_i to transmit the third external clock DQS_e. When the second selecting circuit 226 receives the disabled mode selection signal M_s, the seventh synchronous buffer 224-1 may synchronize the memory-transmitting data DQ_mo with the second internal clock WCK_i to transmit the third external clock DQS_e.

The third external clock-receiving circuit 133 of the controller 100, i.e., the first buffer 133-1 may buffer the third external clock DQS_e. The first buffer 133-1 may transmit the buffered third external clock DQS_e to the second synchronous buffer 132-2 of the first data-transmitting/receiving circuit 132.

The second synchronous buffer 132-2 may synchronize the external data DQ_e with the third external clock DQS_e received from the first buffer 133-1. The second synchronous buffer 132-1 may transmit the controller-receiving data DQ_ci.

According to an example of an embodiment, when the mode selection signal M_s is disabled, the command and the address may be transmitted from the controller to the semiconductor memory device using the first external clock CLK_e. Further, when the mode selection signal M_s is disabled, the data may be transmitted between the controller and the semiconductor memory device using the second external clock WCK_e. Thus, the semiconductor system may process the command and the address using the first external clock CLK_e, i.e., the command/address-decoding clock CLK_e, and the data using the second external clock WCK_e, i.e., the data-receiving clock WCK_e. As a result, when the frequency of the data-receiving clock WCK_e is higher than the frequency of the first external clock CLK_e, the semiconductor system may transmit and receive of the data including a lot of bits capable of reading or writing one time relatively than the command and the address.

Further, when the mode selection signal M_s is enabled, the command and the address may be transmitted from the controller to the semiconductor memory device using the first external clock CLK_e. Further, when the mode selection signal M_s is enabled, the data may be transmitted from the controller to the semiconductor memory device using the second external clock WCK_e. When the mode selection signal M_s is enabled, the data may be transmitted from the semiconductor memory device to the controller using the first external clock CLK_e. Thus, the semiconductor system may process the command and the address using the first external clock CLK_e, i.e., the command/address-decoding clock CLK_e, and the data using the second external clock WCK_e, i.e., the data-receiving clock WCK_e. As a result, when the frequency of the data-receiving clock WCK_e is substantially the same as the frequency of the first external clock CLK_e, a current for processing the command, the address and the data may be decreased.

The semiconductor system as discussed above (see FIGS. 1-4) are particular useful in the design of memory devices, processors, and computer systems. For example, referring to FIG. 5, a block diagram of a system employing a semiconductor system in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

Figure 5:
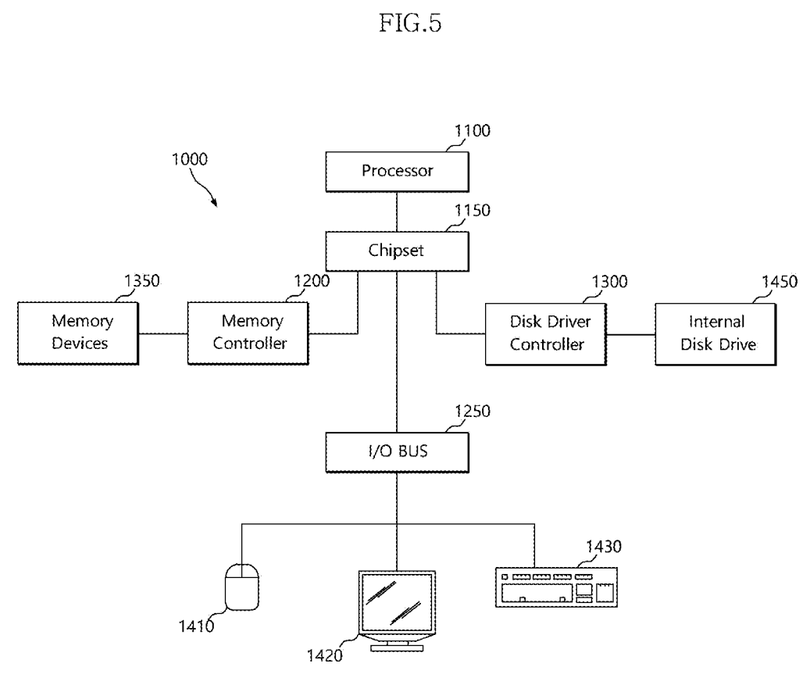
FIG. 5 illustrates a block diagram of an example of a representation of a system employing a semiconductor system with the various embodiments discussed above with relation to FIGS. 1-4.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor system as discussed above with reference to FIGS. 1-4. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor system as discussed above with relation to FIGS. 1-4, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 5 is merely one example of a system 1000 employing a semiconductor system as discussed above with relation to FIGS. 1-4. In alternate embodiments, such as, for example but not limited to, cellular phones or digital cameras, the components may differ from the embodiments illustrated in FIG. 5.

The above embodiments of the present disclosure are illustrative and not limitative. Various alternatives and equivalents are possible. The examples of the embodiments are not limited by the embodiments described herein. Nor is the present disclosure limited to any specific type of semiconductor device. Other additions, subtractions, or modifications are obvious in view of the present disclosure and are intended to fall within the scope of the appended claims.

What is claimed is:

1. A semiconductor system comprising:
   a controller configured to provide an external command, an external address and a first external clock, and transmit a second external clock and receive a third external clock for transmitting and receiving (transmitting/receiving) an external data; and
   a semiconductor memory device configured to synchronize the external command and the external address with the first external clock and receive the synchronized external command and the synchronized external address, synchronize the external data with the second external clock and receive the synchronized external data, and provide the external data and the third external clock to the controller.

2. The semiconductor system of claim 1, wherein the controller comprises:
   a command/address-transmitting circuit configured to provide the external command and the external address;
   a first external clock-transmitting circuit configured to transmit the first external clock;
   a second external clock-transmitting circuit configured to transmit the second external clock;
   a first data-transmitting/receiving circuit configured to synchronize the external data with the second external clock and receive the synchronized external data, and synchronize the external data with the third external clock and receive the synchronized external data; and
   a third external clock-receiving circuit configured to buffer the third external clock and receive the buffered third external clock.

3. The semiconductor system of claim 2, wherein the controller further comprises a clock-generating circuit configured to provide the first external clock-transmitting circuit and the second external clock-transmitting circuit with clocks for generating the first external clock and the second external clock.

4. The semiconductor system of claim 3, wherein the clock-generating circuit comprises a phase locked loop (PLL) circuit or a delay locked loop (DLL) circuit.

5. The semiconductor system of claim 1, wherein the second external clock has a frequency higher than a frequency of the first external clock.

6. The semiconductor system of claim 2, wherein the semiconductor memory device comprises:
   a command/address/clock-receiving circuit configured to synchronize the external command and the external address with the first external clock and receive the synchronized external command and the synchronized external address;
   a logic circuit configured to respond to a transmitting signal of the command/address/clock-receiving circuit;
   a second data-transmitting/receiving circuit configured to transmit and receive the external data based on the second external clock; and a third external clock-transmitting circuit configured to transmit a data-transmitting signal as the third external clock based on the second external clock.

* * * * *